(12) United States Patent
Cropper et al.

(10) Patent No.: US 10,998,848 B2
(45) Date of Patent: May 4, 2021

(54) METHOD OF ROUTING AND SECURING ELECTRICAL POWER CABLES FOR A SOLAR ROOF INSTALLATION

(71) Applicant: Solarmass Energy Group Ltd., Vancouver (CA)

(72) Inventors: Paul Julian Cropper, Vancouver (CA); Brian Roth, Vancouver (CA); Paul Henderson, New Westminster (CA)

(73) Assignee: SOLARMASS ENERGY GROUP LTD., Vancouver (CA)

( * ) Notice: Subject to any disclaimer, the term of this patent is extended or adjusted under 35 U.S.C. 154(b) by 0 days.

(21) Appl. No.: 16/735,766

(22) Filed: Jan. 7, 2020

(65) Prior Publication Data

US 2020/0321906 A1   Oct. 8, 2020

Related U.S. Application Data

(62) Division of application No. 16/372,646, filed on Apr. 2, 2019, now Pat. No. 10,530,292.

(51) Int. Cl.
| | |
|---|---|
| *H02S 20/25* | (2014.01) |
| *H02S 40/34* | (2014.01) |
| *H02G 1/02* | (2006.01) |
| *H01R 13/73* | (2006.01) |
| *H02S 40/36* | (2014.01) |

(52) U.S. Cl.
CPC ............ *H02S 20/25* (2014.12); *H01R 13/73* (2013.01); *H02G 1/02* (2013.01); *H02S 40/34* (2014.12); *H02S 40/36* (2014.12)

(58) Field of Classification Search
CPC .......... H02S 20/25; H02S 20/23; H02S 20/24; H02S 40/34; H02S 40/36; H01R 13/73; F24S 2020/13; F24S 2020/67; F24S 2020/69; F24S 2020/66; E04D 1/12–30; E04D 2001/301–309; Y02B 10/12
See application file for complete search history.

(56) References Cited

U.S. PATENT DOCUMENTS

| | | | | |
|---|---|---|---|---|
| 2,169,727 A | ‡ | 8/1939 | Graham | H04Q 1/14 361/826 |
| 3,774,428 A | ‡ | 11/1973 | Derry | B29C 44/22 118/44 |
| 4,288,959 A | ‡ | 9/1981 | Murdock | E04D 1/265 52/518 |

(Continued)

FOREIGN PATENT DOCUMENTS

| | | |
|---|---|---|
| CN | 201893358 | 7/2011 |
| EP | 2169727 | 3/2010 |

(Continued)

*Primary Examiner* — Kyle J. Walraed-Sullivan
(74) *Attorney, Agent, or Firm* — Clark & Brody LP

(57) ABSTRACT

A solar roof tile with an integrated cable management system includes a roof tile weighing less than 400 lbs per 100 square feet of installed roof area and a photovoltaic solar panel attached to a front side of the roof tile. A rear side of the roof tile includes one or more channels configured to accommodate one or more electrical power cables. A method of routing and securing electrical power cables for a solar roof installation using the solar roof tiles is also disclosed.

10 Claims, 12 Drawing Sheets

(56) References Cited

U.S. PATENT DOCUMENTS

| | | | | |
|---|---|---|---|---|
| 4,498,267 A ‡ | 2/1985 | Beck | ................... | E04D 3/34 |
| | | | | 52/309.1 |
| 4,582,953 A ‡ | 4/1986 | Nagase | ................... | F24S 20/69 |
| | | | | 136/259 |
| 5,776,262 A ‡ | 7/1998 | Melchior | ............... | H01L 31/048 |
| | | | | 136/251 |
| 5,986,203 A ‡ | 11/1999 | Hanoka | ............. | B32B 17/10018 |
| | | | | 136/251 |
| 5,990,414 A ‡ | 11/1999 | Posnansky | ............ | H01L 31/048 |
| | | | | 136/244 |
| 6,066,797 A ‡ | 5/2000 | Toyomura | ............. | H01L 31/048 |
| | | | | 136/251 |
| 6,105,317 A ‡ | 8/2000 | Tomiuchi | ............... | E04D 3/08 |
| | | | | 52/173.3 |
| 6,294,724 B1 * | 9/2001 | Sasaoka | ............... | H01L 31/048 |
| | | | | 136/244 |
| 6,307,144 B1 ‡ | 10/2001 | Mimura | ................... | H01L 31/05 |
| | | | | 136/244 |
| 6,360,497 B1 ‡ | 3/2002 | Nakazima | ................. | E04D 1/24 |
| | | | | 156/62 |
| 6,453,629 B1 ‡ | 9/2002 | Nakazima | ............. | F24S 40/44 |
| | | | | 52/173.3 |
| 7,442,872 B2 ‡ | 10/2008 | Umemoto | ............. | H01L 31/048 |
| | | | | 136/251 |
| 7,718,288 B2 ‡ | 5/2010 | Murphy | ............ | H01M 8/04552 |
| | | | | 429/465 |
| 8,168,880 B2 ‡ | 5/2012 | Jacobs | ..................... | E04D 1/26 |
| | | | | 136/244 |
| 8,522,493 B1 ‡ | 9/2013 | Rogers | ..................... | E04D 3/30 |
| | | | | 52/173.3 |
| 9,800,053 B2 ‡ | 10/2017 | Beitel | ................... | H01L 31/048 |
| 2002/0043277 A1 ‡ | 4/2002 | Yamawaki | ................ | E04D 1/30 |
| | | | | 136/244 |
| 2004/0187909 A1 ‡ | 9/2004 | Sato | ........................ | H02S 20/23 |
| | | | | 136/251 |
| 2005/0076948 A1 ‡ | 4/2005 | Komamine | ............ | H02S 20/25 |
| | | | | 136/251 |
| 2005/0141153 A1 ‡ | 6/2005 | Mucci | ................... | H01L 31/048 |
| | | | | 361/20 |
| 2005/0178430 A1 ‡ | 8/2005 | McCaskill | ............... | E04D 1/26 |
| | | | | 136/251 |
| 2005/0252140 A1 ‡ | 11/2005 | Faulkner | .................. | E04D 1/34 |
| | | | | 52/542 |
| 2007/0181174 A1 ‡ | 8/2007 | Ressler | ................. | H02S 20/23 |
| | | | | 136/251 |
| 2007/0227583 A1 ‡ | 10/2007 | Davies | ................... | F24S 20/69 |
| | | | | 136/251 |
| 2008/0000174 A1 ‡ | 1/2008 | Flaherty | .................... | E04D 1/08 |
| | | | | 52/173.3 |
| 2008/0000512 A1 ‡ | 1/2008 | Flaherty | .................... | E04D 1/30 |
| | | | | 136/244 |
| 2008/0041434 A1 ‡ | 2/2008 | Adriani | .................. | B23K 31/02 |
| | | | | 136/244 |
| 2008/0110490 A1 ‡ | 5/2008 | Duesterhoeft | .......... | H02S 40/34 |
| | | | | 136/248 |
| 2008/0115911 A1 ‡ | 5/2008 | Duesterhoeft | .......... | H02S 40/34 |
| | | | | 165/104.21 |
| 2008/0135094 A1 ‡ | 6/2008 | Corrales | ............... | H01L 31/052 |
| | | | | 136/259 |
| 2008/0289272 A1 ‡ | 11/2008 | Flaherty | ................. | H02S 20/25 |
| | | | | 52/173.3 |
| 2008/0289679 A1 ‡ | 11/2008 | Ressler | ..................... | E04D 1/08 |
| | | | | 136/244 |
| 2008/0302030 A1 ‡ | 12/2008 | Stancel | ............... | H01L 31/02008 |
| | | | | 52/173.3 |
| 2008/0302031 A1 | 12/2008 | Bressler et al. | | |
| 2008/0302409 A1 ‡ | 12/2008 | Bressler | ................ | H02S 20/25 |
| | | | | 136/251 |
| 2008/0313976 A1 ‡ | 12/2008 | Allen | ..................... | H01L 31/048 |
| | | | | 52/173.1 |
| 2009/0000221 A1 ‡ | 1/2009 | Jacobs | ................... | H02S 20/23 |
| | | | | 52/173.3 |
| 2009/0126782 A1 ‡ | 5/2009 | Krause | ............... | H01L 31/02008 |
| | | | | 136/251 |
| 2009/0133340 A1 ‡ | 5/2009 | Shiao | ..................... | H02S 20/23 |
| | | | | 52/173.3 |
| 2009/0133739 A1 ‡ | 5/2009 | Shiao | .................... | H01L 31/048 |
| | | | | 136/251 |
| 2009/0142945 A1 ‡ | 6/2009 | Duesterhoeft | .......... | H02S 40/34 |
| | | | | 439/80 |
| 2009/0159118 A1 ‡ | 6/2009 | Kalkanoglu | .............. | E04D 5/02 |
| | | | | 136/251 |
| 2009/0178350 A1 ‡ | 7/2009 | Kalkanoglu | ........ | E04F 13/0864 |
| | | | | 52/173.3 |
| 2009/0242015 A1 ‡ | 10/2009 | Wattman | ................ | H01L 31/048 |
| | | | | 136/251 |
| 2010/0084003 A1 ‡ | 4/2010 | Chen | ................... | H01L 31/0504 |
| | | | | 136/244 |
| 2010/0101634 A1 ‡ | 4/2010 | Frank | ...................... | H02S 20/23 |
| | | | | 136/251 |
| 2010/0116325 A1 ‡ | 5/2010 | Nikoonahad | ....... | H01L 27/1421 |
| | | | | 136/251 |
| 2010/0170169 A1 ‡ | 7/2010 | Railkar | ..................... | E04D 1/26 |
| | | | | 52/173.3 |
| 2010/0201493 A1 ‡ | 8/2010 | Takano | ............. | H01L 31/02021 |
| | | | | 340/10.1 |
| 2010/0212740 A1 ‡ | 8/2010 | Barth | ................ | H01L 31/02013 |
| | | | | 136/259 |
| 2010/0294341 A1 ‡ | 11/2010 | Frank | ...................... | H02S 20/23 |
| | | | | 136/251 |
| 2010/0313499 A1 ‡ | 12/2010 | Gangemi | ................ | H02S 20/25 |
| | | | | 52/173.3 |
| 2010/0326488 A1 ‡ | 12/2010 | Aue | ........................ | H02S 20/23 |
| | | | | 136/244 |
| 2011/0048504 A1 ‡ | 3/2011 | Kinard | ............. | H01L 31/02008 |
| | | | | 136/251 |
| 2011/0132427 A1 ‡ | 6/2011 | Kalkanoglu | ............ | H02S 20/23 |
| | | | | 136/244 |
| 2011/0155220 A1 ‡ | 6/2011 | Lee | ......................... | H02S 20/25 |
| | | | | 136/251 |
| 2011/0162290 A1 ‡ | 7/2011 | Nightingale | ........ | E04F 13/0851 |
| | | | | 52/27 |
| 2011/0162301 A1 ‡ | 7/2011 | Ueda | ....................... | H02S 40/36 |
| | | | | 52/173.3 |
| 2011/0168228 A1 ‡ | 7/2011 | McGreevy | ............. | H02S 40/34 |
| | | | | 136/244 |
| 2011/0217856 A1 ‡ | 9/2011 | Vijh | .................... | H01R 13/5205 |
| | | | | 439/76.1 |
| 2012/0085040 A1 ‡ | 4/2012 | Ketwitz, Jr. | ............ | H01L 31/05 |
| | | | | 52/173.3 |
| 2012/0161527 A1 ‡ | 6/2012 | Casey | ............... | H01L 31/02021 |
| | | | | 307/80 |
| 2012/0186630 A1 ‡ | 7/2012 | Jenkins | ................... | E04D 13/04 |
| | | | | 136/251 |
| 2012/0204927 A1 ‡ | 8/2012 | Peterson | ................ | H01L 31/048 |
| | | | | 136/244 |
| 2012/0233940 A1 ‡ | 9/2012 | Perkins | ................... | H02S 30/10 |
| | | | | 52/173.3 |
| 2012/0240490 A1 ‡ | 9/2012 | Gangemi | ................ | F24S 25/40 |
| | | | | 52/173.3 |
| 2012/0272592 A1 ‡ | 11/2012 | Bellavia | .................... | E04D 1/20 |
| | | | | 52/173.3 |
| 2012/0291848 A1 ‡ | 11/2012 | Sherman | ............... | H01L 31/052 |
| | | | | 136/246 |
| 2012/0304559 A1 ‡ | 12/2012 | Ishida | ................... | H01L 31/046 |
| | | | | 52/173.3 |
| 2012/0312373 A1 ‡ | 12/2012 | Hudson, Jr. | ............. | H01L 31/05 |
| | | | | 136/259 |
| 2013/0003307 A1 ‡ | 1/2013 | Jang | ........................ | H02S 40/34 |
| | | | | 361/709 |
| 2013/0010450 A1 ‡ | 1/2013 | Xiao | ........................ | H01L 31/05 |
| | | | | 361/826 |
| 2013/0012059 A1 ‡ | 1/2013 | Xiao | ........................ | H02G 3/16 |
| | | | | 439/535 |
| 2013/0012060 A1 ‡ | 1/2013 | Xiao | ........................ | H02G 3/16 |
| | | | | 439/535 |
| 2013/0125482 A1 ‡ | 5/2013 | Kalkanoglu | ............ | H02S 30/10 |
| | | | | 52/173.3 |

(56) References Cited

U.S. PATENT DOCUMENTS

| | | | | |
|---|---|---|---|---|
| 2013/0160382 A1 ‡ | 6/2013 | Schick | ............... | F24S 25/40 |
| | | | | 52/173.3 |
| 2013/0167898 A1 ‡ | 7/2013 | Hong | ............... | H01L 31/0201 |
| | | | | 136/244 |
| 2013/0169056 A1 ‡ | 7/2013 | Sherman | ............... | H01L 31/05 |
| | | | | 307/86 |
| 2013/0170149 A1 ‡ | 7/2013 | Reese | ............... | H01R 13/5202 |
| | | | | 361/728 |
| 2013/0180575 A1 ‡ | 7/2013 | Jackrel | ............... | H01L 31/0504 |
| | | | | 136/251 |
| 2013/0212959 A1 ‡ | 8/2013 | Lopez | ............... | H02S 40/36 |
| | | | | 52/173.3 |
| 2013/0298958 A1 ‡ | 11/2013 | Kopylov | ............... | H01L 31/05 |
| | | | | 136/244 |
| 2013/0298970 A1 ‡ | 11/2013 | Park | ............... | H01L 31/042 |
| | | | | 136/251 |
| 2013/0333303 A1 ‡ | 12/2013 | Elisary | ............... | H02S 20/23 |
| | | | | 52/11 |
| 2014/0041715 A1 * | 2/2014 | Carolan | ............... | H01L 31/05 |
| | | | | 136/251 |
| 2014/0196770 A1 ‡ | 7/2014 | Jacobs, IV | ............... | H01L 31/18 |
| | | | | 136/251 |
| 2014/0332073 A1 ‡ | 11/2014 | Chen | ............... | H01L 31/048 |
| | | | | 136/258 |
| 2014/0352760 A1 * | 12/2014 | Haynes | ............... | H02J 50/30 |
| | | | | 136/246 |
| 2014/0366464 A1 ‡ | 12/2014 | Rodrigues | ............... | H02S 40/32 |
| | | | | 52/173.3 |
| 2015/0114447 A1 ‡ | 4/2015 | Kang | ............... | H02S 40/34 |
| | | | | 136/244 |
| 2015/0114955 A1 ‡ | 4/2015 | Inaba | ............... | H02G 3/12 |
| | | | | 220/3.92 |
| 2015/0136206 A1 ‡ | 5/2015 | Paul | ............... | H02S 20/25 |
| | | | | 136/251 |
| 2015/0155822 A1 ‡ | 6/2015 | Feng | ............... | H01L 31/03926 |
| | | | | 136/259 |
| 2015/0354217 A1 ‡ | 12/2015 | Lucas | ............... | E04D 1/30 |
| | | | | 52/588.1 |
| 2016/0105142 A1 ‡ | 4/2016 | Johansen | ............... | H02S 20/23 |
| | | | | 52/126.1 |
| 2016/0105144 A1 ‡ | 4/2016 | Haynes | ............... | H01L 31/048 |
| | | | | 136/244 |
| 2016/0105145 A1 ‡ | 4/2016 | Drake | ............... | H02S 20/25 |
| | | | | 136/251 |
| 2016/0164453 A1 ‡ | 6/2016 | Cropper | ............... | H02S 20/25 |
| | | | | 136/251 |
| 2016/0254776 A1 ‡ | 9/2016 | Rodrigues | ............... | H02S 20/23 |
| | | | | 52/173.3 |
| 2017/0237390 A1 ‡ | 8/2017 | Hudson | ............... | E04D 3/366 |
| | | | | 136/251 |
| 2017/0321933 A1 ‡ | 11/2017 | Kvasnicka | ............... | H02S 20/23 |
| 2018/0054155 A1 ‡ | 2/2018 | Werner | ............... | H02S 20/25 |
| 2018/0115275 A1 ‡ | 4/2018 | Flanigan | ............... | H02S 20/25 |
| 2018/0123504 A1 ‡ | 5/2018 | Almy | ............... | H02S 20/25 |
| 2018/0183382 A1 ‡ | 6/2018 | Hall | ............... | H02S 20/25 |
| 2018/0331652 A1 ‡ | 11/2018 | Okawa | ............... | H02S 40/32 |
| 2018/0351502 A1 ‡ | 12/2018 | Almy | ............... | H02S 20/25 |
| 2019/0028054 A1 ‡ | 1/2019 | Karkheck | ............... | H02S 20/25 |
| 2019/0074792 A1 ‡ | 3/2019 | Hakenberg | ............... | F24S 80/30 |
| 2019/0089299 A1 ‡ | 3/2019 | Hakenberg | ............... | H02S 20/25 |
| 2019/0123679 A1 ‡ | 4/2019 | Rodrigues | ............... | H02S 20/23 |
| 2019/0123682 A1 ‡ | 4/2019 | Fang | ............... | H02S 40/345 |
| 2019/0165720 A1 * | 5/2019 | Quinlan | ............... | H01L 31/0504 |

FOREIGN PATENT DOCUMENTS

| | | |
|---|---|---|
| JP | 06-085306 | 3/1994 |
| JP | 2005-240274 | 9/2005 |
| WO | 2012/064288 | 5/2012 |
| WO | 2012/120489 | 9/2012 |

\* cited by examiner

‡ imported from a related application

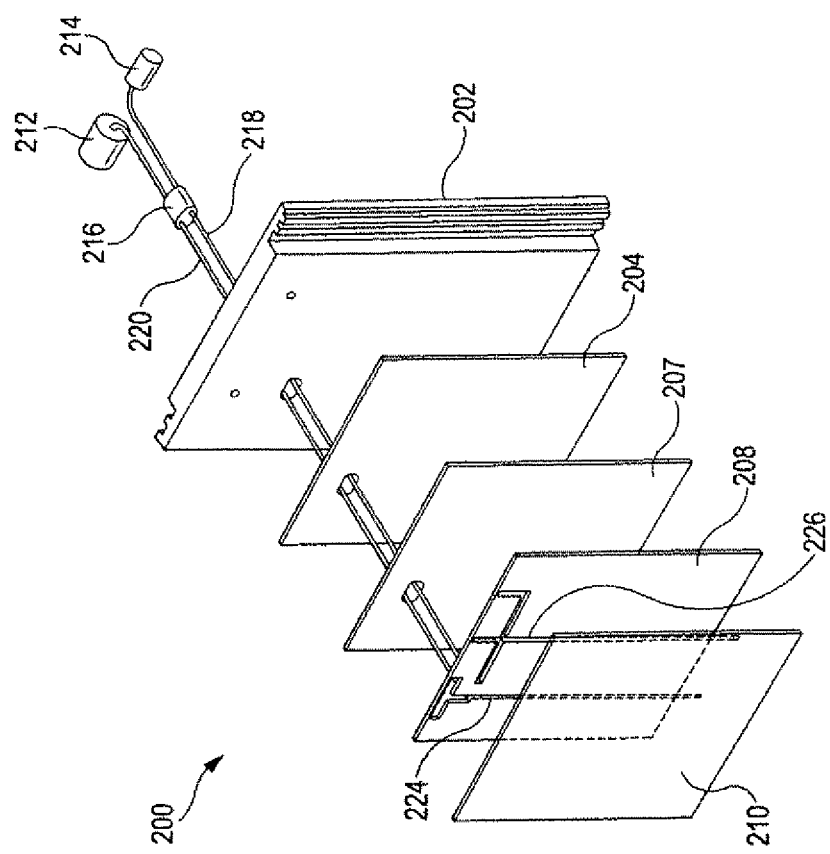

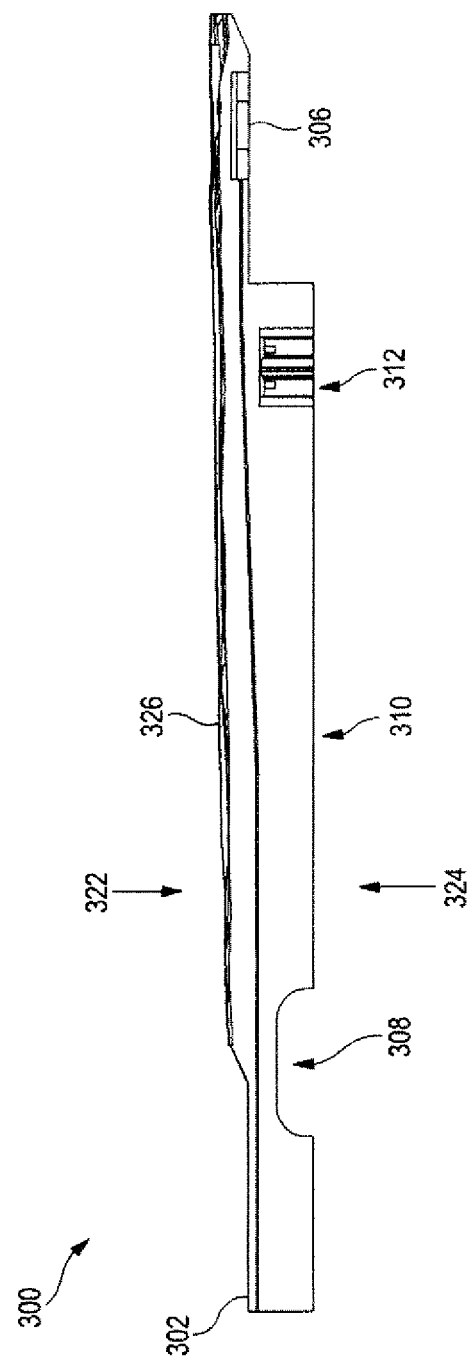

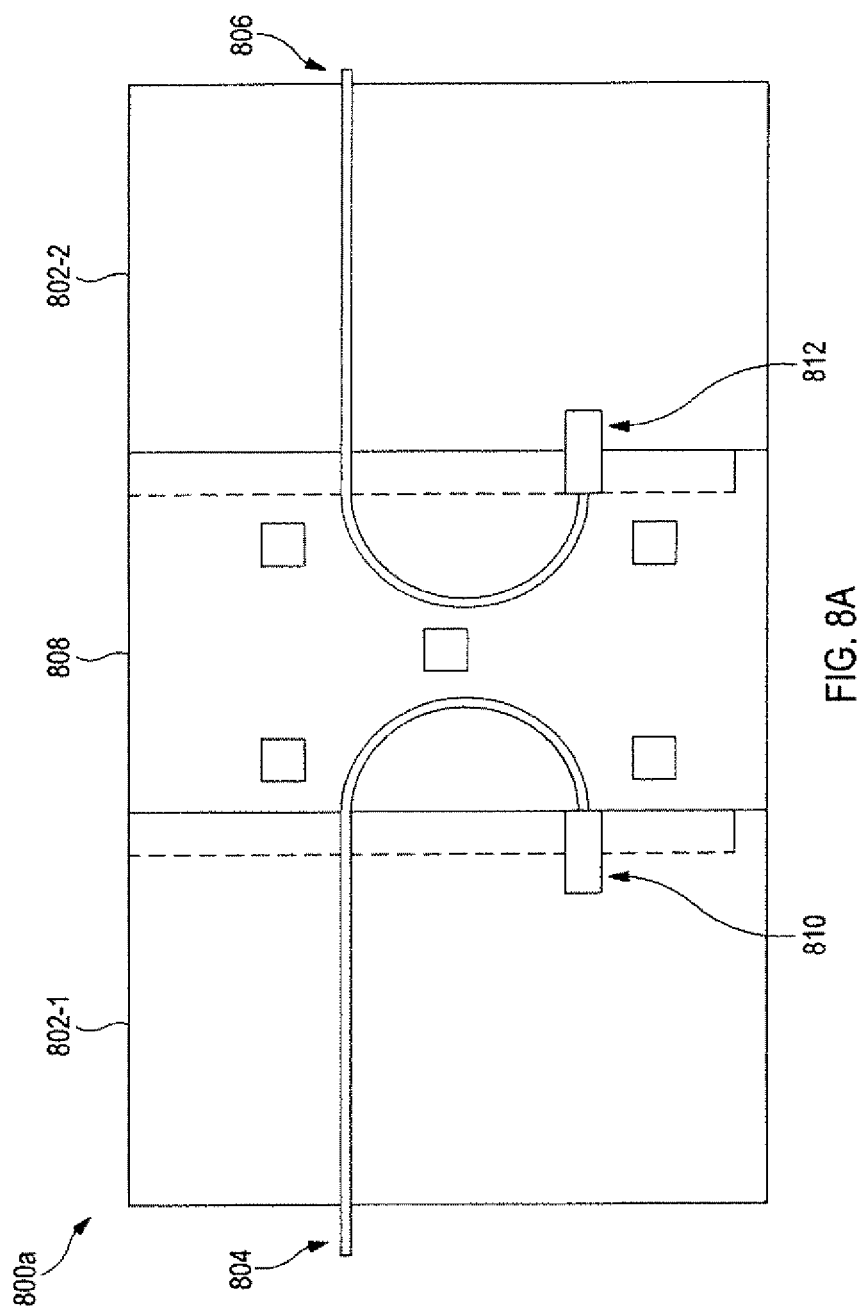

METHOD OF ROUTING AND SECURING ELECTRICAL POWER CABLES FOR A SOLAR ROOF INSTALLATION

This application is a Divisional of U.S. Ser. No. 16/372,646 filed on Apr. 2, 2019.

TECHNICAL FIELD

The present application relates to a photovoltaic system, and, in particular, to a solar roof tile.

BACKGROUND

Photovoltaic solar panels are known which absorb solar and ultra violet rays, transforming them into electrical energy. A photovoltaic solar panel typically includes one or more photovoltaic solar cells. Practical applications of photovoltaic solar panels include photovoltaic power stations, solar vehicles, and solar roofs.

BRIEF SUMMARY

The present application describes example implementations of a solarized roof tile system that include novel features for routing and management of cables carrying electrical power generated by photovoltaic solar panels attached to one or more roof tiles of the solarized roof tile system with the installed arrays of tiles weighing within the same range as asphalt shingle roof systems, typically between 200 lbs and 400 lbs per roofing square (100 square feet).

Some implementations include one or more tiles to which a photovoltaic solar panel has not been attached and/or one or more tiles not used in the generation of electrical power (also referred to in the present application as dummy tiles). The use of dummy tiles can be advantageous to the routing and management of cables carrying electrical power generated by photovoltaic solar panels attached to solarized roof tiles.

One embodiment of the invention includes a solar roof tile with an integrated cable management system. The roof tile is constructed such that unit weight when considering 100 square feet of installed roof area is less than 400 lbs per 100 square feet of installed roof area. The roof tile also has a photovoltaic solar panel attached to a front side of the roof tile. A rear side of the roof tile includes one or more channels configured to accommodate one or more electrical power cables. The roof tile can be made of any material that meets the weight specification above, including plastic, metal, composite materials, and the like. A preferred material is a plastic material that is injection molded to form the roof tile.

The roof tile can have other features as well for cable management and operation, including a hole extending from the front side of the roof tile to the rear side of the roof tile, a junction box located in the hole extending from the front side of the roof tile to the rear side of the roof tile, wherein the junction box includes a first DC connector insertable from the front side of the roof tile, and a second DC connector insertable from the rear side of the roof tile, and one or more electrical connections accessible at the rear side of the roof tile, the one or more electrical connections passing through the hole extending from the front side of the roof tile to the rear side of the roof tile via a junction box, wherein the junction box is attached to a rear side of the photovoltaic solar panel.

The photovoltaic solar panel comprises one or more photovoltaic solar cells attached to the front side of the roof tile. In operation, the photovoltaic solar panel provides a single positive output connected to a positive conductor, and a single negative output connected to a negative conductor, each of the positive and the negative connectors passing through the hole extending from the front side of the roof tile to the rear side of the roof tile.

The roof tile can also include a cable cross-over chamber formed in the rear side of the roof tile. In operation, the cable cross-over chamber accommodates one or more electrical cables that include the single positive conductor and the single negative conductor.

The roof tile can also include a pair of connector clips located on opposite sides of the roof tile. Each connector clip of the pair of connector clips is operable to hold a respective connector in place and prevent axial rotation of the respective connector.

Other components of the photovoltaic solar panel include a printed circuit board, wherein a plurality of photovoltaic solar cells of the panel are each electrically connected to the printed circuit board, and a front sheet comprising a layer of plastic. The printed circuit board, the plurality of photovoltaic solar cells, and the layer of plastic can be laminated into a unitary structure.

The one or more electrical power cables include at least one of a combiner cable, and a cable that includes at least one of a positive conductor and a negative conductor electrically connected to the photovoltaic solar panel.

The roof tiles can also be arranged in one or more arrays of roof tiles with adjacent roof tiles in the array electrically connected together. The apparatus can also include one or more dummy tiles. The dummy tile could be positioned adjacent a last roof tile in an array of roof tiles, and a first cable could be electrically connected to the last roof tile. The dummy tile is configured to route the cable beneath the dummy tile and through at least one of the channels of each of the roof tiles in the array to provide electrical power output from the photovoltaic solar panel of the array of roof tiles. The cable used under the dummy tile could be a combiner cable. A second array of roof tiles could be used and positioned on the other side of the dummy tile with a last roof tile in the second array adjacent to the dummy time. A second cable can be provided, the second cable being electrically connected to the last roof tile of the second array. In this configuration, the cables from the first and second arrays could be routed through a respective channel of the array that the cable is connected to or the cables could cross over and be routed through channels in the other array.

Another aspect of the invention is a method of connecting the roof tiles together. This method involves routing and securing electrical power cables for a solar roof installation, wherein the solar roof installation has at least a first and a second roof tile, a first photovoltaic solar panel attached to a first front side of the first roof tile, and a second photovoltaic solar panel attached to a second front side of the second roof tile, and a dummy tile adjacent to one of the first or second roof tile. The roof tiles each have one or more channels in a respective rear side thereof. The first roof tile has a first connector clip in the respective rear side of the first roof tile, the first connector clip located at a first lateral edge of the first roof tile. The second roof tile has a second connector clip in the respective rear side of the second roof tile, the second connector clip located at a second lateral edge of the second roof tile. The method further entails securing a first connector and a second connector to the first and the second connector clips, respectively; aligning the first and the second connectors; and then forming a direct electrical connection between the first and the second connectors. A combiner cable can be then routed in the one or more channels in the respective rear side of each of the first and the second roof tiles, the combiner cable electrically connected to one of the first and second connectors via the dummy tile, the combiner cable providing electrical power output from the first and second photovoltaic solar panels of the at least first and second roof tiles.

Further aspects and details of example implementations are set forth in the drawings and following detailed discussion.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 2A is a schematic diagram in exploded view of an example implementation of a solar roof tile that includes a photovoltaic solar panel attached to a front face of a roof tile.

FIG. 5 is a side elevation view of the solar roof tile of FIG. 3.

FIG. 8A is a schematic diagram of an example implementation of another portion of a roof installation illustrating an electrical communicative coupling between solar roof tiles and combiner cables.

DEFINITION OF TERMS

Solar Roof Tile: A solar roof tile is a roof tile to which a photovoltaic solar panel has been attached and/or which is electrically connected to the electrical power output of the solar roof installation and/or which is electrically connected so as to contribute electrical power to a power output of the solar roof installation. In the described system, the solar roof tile has a target weight between 200 lbs and 400 lbs per 100 square feet installed, and is typically made from metal and/or plastic.

Dummy Tile: A dummy tile in a solar roof installation is a roof tile to which a photovoltaic solar panel has not been attached and/or which is electrically disconnected from the electrical power output of the solar roof installation, and/or which is electrically connected so as not to contribute electrical power to a power output of the solar roof installation. In the described system, the dummy tile has a target weight no more than 10% different (plus or minus) than the Solar Roof Tile defined above.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with power converters, power storage devices, switches and electrical connectors, have not been shown or described in detail to avoid unnecessarily obscuring descriptions of the embodiments.

Unless the context requires otherwise, throughout the specification and claims which follow, the word "comprise" and variations thereof, such as "comprises" and "comprising," are synonymous with "include" and variations thereof, and are to be construed in an open, inclusive sense, (i.e., does not exclude additional, unrecited elements or method acts).

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Figure 1A:
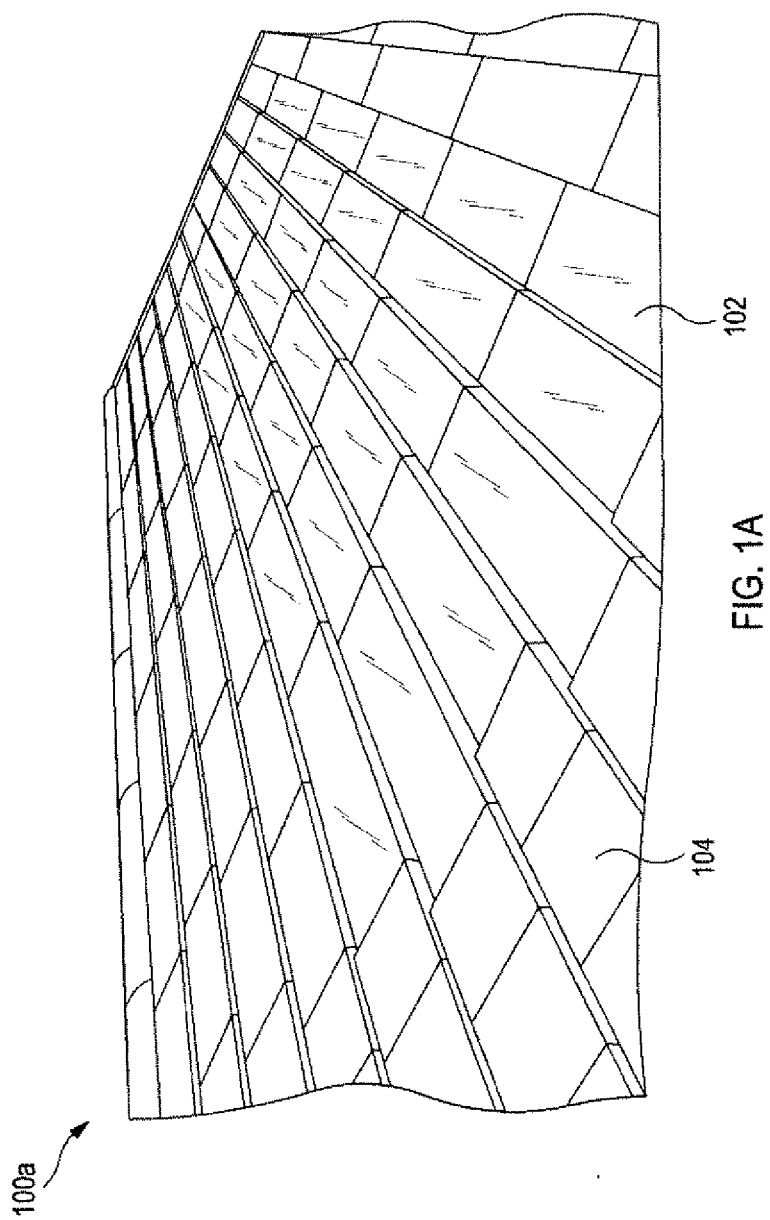
FIG. 1A is a schematic diagram of an example implementation of a portion of a roof installation that includes one or more solar roof tiles.

FIG. 1A is a schematic diagram of an example implementation of a roof installation 100a that includes one or more solar roof tiles (for example, solar roof tile 102 of FIG. 1A). FIG. 1A illustrates in perspective view a roof installation solar roof tiles integrated into an existing tile roof (for example, an existing concrete tile roof). An existing tile roof can include one or more roof tiles (for example, roof tile 104 of FIG. 1A). In the illustrated example of FIG. 1A, solar roof tile 102 has a width of approximately three roof tiles. To install a row of solar roof tiles, a row of roof tiles can be removed, and solar roof tiles can be fitted in place of the removed roof tiles. The solar roof tiles can be fitted to rafters in the roof.

Roof installation 100a can be installed as part of an existing tile roof that includes solarized and non-solarized roof tiles. As described in more detail below in reference to solar roof tile 300 of FIG. 3, roof installation 100a can be a complete roof where one or more non-solarized roof tiles are dummy tiles advantageously deployed to improve efficiency of cable routing and management of roof installation 100a.

In one implementation, electrical connections to the solar roof tiles are passed through a waterproof membrane of the roof, and electrical connectors at the rear of each roof tile are connected into an electrical circuit within the loft of the roof. It can be desirable to avoid having to perforate the waterproof membrane to pass electrical connections to the solar roof tiles. So, in another implementation, the electrical connectors are connected on top of the waterproof membrane, and routed to the edge of the roof, so that a single electrical cable can be fitted outside the building down to an electrical junction box at ground level.

In yet another implementation, a roof installation can include a string of solar roof tiles (for example, a string of fifty solar roof tiles). Electrical connections from each string of solar roof tiles can pass through the roof or the cave, and into the loft or attic space, for connecting to an electrical circuit inside the building. Multiple strings can be combined.

Figure 1B:
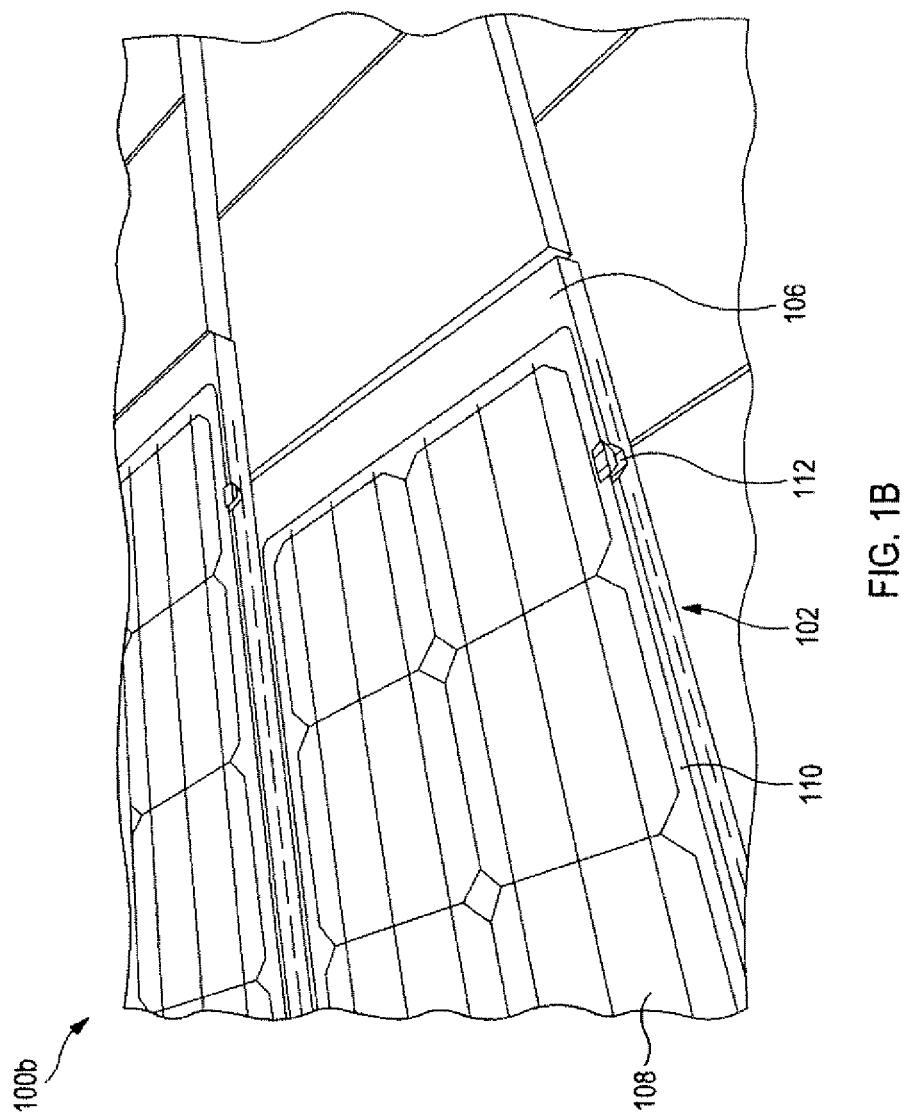
FIG. 1B is a schematic diagram of an example implementation of a portion of a roof installation that includes a solar roof tile with a photovoltaic solar panel.

FIG. 1B is a schematic diagram of an example implementation of a portion of a roof installation 200 that includes a solar roof tile (for example, solar roof tile 102 of FIG. 1A) with a photovoltaic solar panel. Solar roof tile 102 includes a substrate 106, for example made of a plastic sheet, of a thickness similar to a thickness of an adjacent concrete tile. On top of substrate 106, are positioned a plurality of substantially square solar panels (for example, solar panel 108). On top of solar panel 108, is positioned a glass or plastic cover sheet 110, which is held to substrate 106 by one or more external clips (for example, external clip 112) around the edges of cover sheet 110. In other implementations, glass or plastic cover sheet 110 is included with solar panel 108 in a laminated structure, and the laminated structure is adhered to the roof tile, for example by a silicone material.

FIG. 2A is a schematic diagram in exploded view of an example implementation of a solar roof tile 200 that includes a photovoltaic solar panel attached to a front face of a roof tile. Solar roof tile 200 includes a roof tile 202, a silicone based adhesive sealant layer 204, a fiber glass back plate 206, a printed circuit board 208, and an ultra-violet transparent plastic cover sheet 210.

Figure 2B:
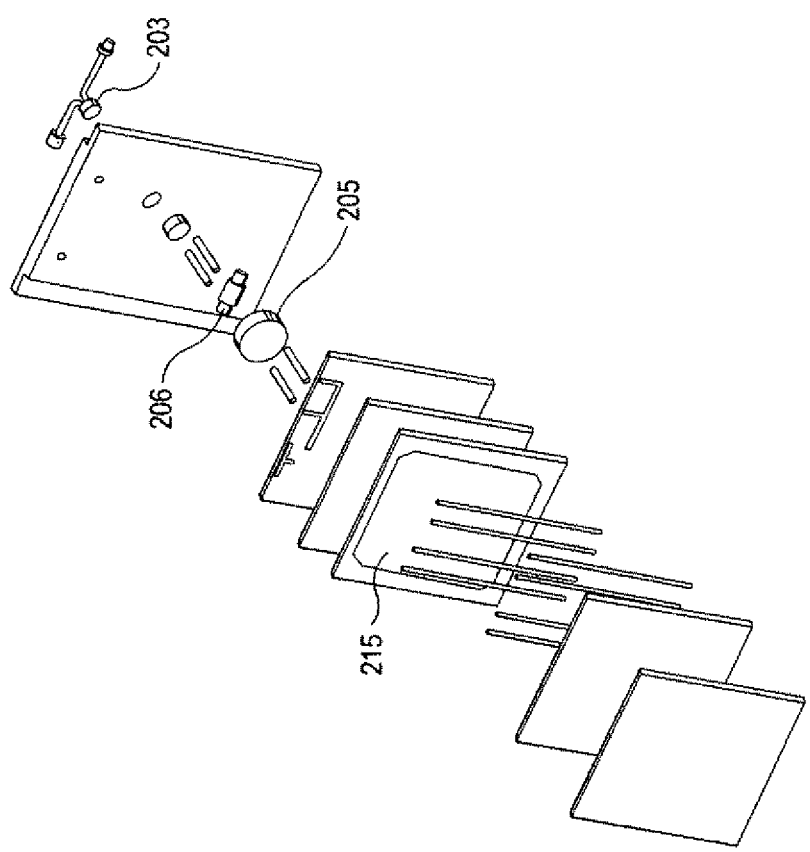
FIG. 2B is a schematic diagram in exploded view of an example implementation of a solar roof tile that includes a photovoltaic solar panel attached to a front face of a roof tile and includes a two-piece junction box housing a bypass diode.

FIG. 2B is a schematic diagram in exploded view of an example implementation of a solar roof tile 200 that includes a sheet 215 in FIG. 2B comprising one or a plurality of monocrystalline or polycrystalline solar cells each comprising one or more solar wafers Solar roof tile 200 further comprises electrical connections which are accessible at the rear of the roof tile, for connecting the solar panel to an electrical circuit. Electrical connections can be passed through a hole in a rear face of roof tile 202 via a junction box (not shown in FIG. 2A) attached to the back of the photovoltaic solar panel.

In the example implementation of FIG. 2A, electrical connections comprise a negative connector 212, a positive connector 214, and a silicone-based seal 216, which fits into an aperture in roof tile 202 and surrounds a pair of positive and negative conductors 218, 220 respectively such that the connectors are spaced apart, and protected from the weather and moisture. Each electrical conductor 218, 220 can include a copper wire surrounded with an insulating plastic sheath, a diode 222 connected to a positive output of the solar cells of sheet 208 and to positive conductor 220, and first and second aluminum strips 224, 226 which respectively form electrical connectors to the solar cells of sheet 208.

Various implementations of solar roof tile 200 of FIG. 2A are described in more detail in U.S. Patent Application Publication US 2016/0164453 A1 entitled "SOLAR ROOF TILE".

A traditional roof tile (for example, roof tile 202 of FIG. 2A) can be made from concrete, slate, ceramic, clay, and the like. A traditional roof tile made from concrete will weigh between 950 lbs and 1,200 lbs per roofing square (defined as 100 square feet of installed area). A lighter weight product frequently used in roofing is asphalt shingles, which typically weigh between 200 lbs and 400 lbs per roofing square. A solar roof tile can be lighter than a traditional concrete tile, constructed to a weight in the same range as asphalt shingles (200-400 lbs per 100 square feet), and can be made from metal, plastic, and/or another suitable material lighter than concrete, slate, ceramic and clay. For a given roof area, a roof constructed using solar roof tiles is lighter than a roof constructed using traditional concrete tiles and will be similar weight to a roof constructed using asphalt shingles. A solar roof tile may use less dense material in its construction, and/or a solar roof tile may be structured such that it has a weight between 200 lbs and 400 lbs per 100 square feet of covered roof area.

Solar roof tiles that weight less than 400 lbs per 100 square feet can be advantageous for roof installations where the structure of the roof is not engineered to withstand the weight of traditional concrete roof tiles. These lighter weight solar roof tiles can be used on a roof with a pitch as low as 11° and high as 900. A roof with a pitch of around 17° is typically regarded as a low-pitch roof. A roof tile weighing less than 400 lbs per 100 square feet can require fewer fixing points to the roof structure than a traditional concrete roof tile, and can be easier to install. Furthermore, a solar roof tile can improve an aesthetic achievable on a low pitch roof; for example by replacing metal or torch-on roofing materials.

A solar roof tile can be made from a polymer or a polymer composite, for example. A polymer can be a plastic, for example. A polymer can be thermoset or thermoplastic, for example. A polymer composite can be a multi-phase material comprising reinforcing fillers integrated with a polymer matrix. The reinforcing fillers can be inorganic materials such as calcium carbonate and glass fibers, for example. A solar roof tile can be manufactured by a process of injection molding.

The present application describes a solar roof tile (also referred to in the present application as a solarized roof tile and a photovoltaic solar roof tile assembly) and methods related to its construction, installation, and operation. The solar roof tile includes a photovoltaic solar panel attached to a front face of a roof tile made from plastic or other suitable lightweight material. The photovoltaic solar panel is operable to generate electrical power. The solar roof tile can be fitted to a roof structure to form a substantially planar roof surface. In one implementation, the solar roof tile is fitted to a roof structure to form a new roof. In another implementation, the solar roof tile is fitted to an existing roof structure as a replacement roof.

The present application describes example implementations for a solarized roof tile system that include novel features for routing and management of cables carrying electrical power generated by photovoltaic solar panels attached to roof tiles. Some implementations include one or more dummy tiles in the solarized roof tile system. A dummy tile is a roof tile to which a photovoltaic solar panel has not been attached. The use of dummy tiles can be advantageous to the routing and management of cables carrying electrical power generated by photovoltaic solar panels attached to solarized roof tiles.

The routing and management of cables in a solar roof tile paves the way for solarizing roofs using composite roof tiles that are lower in weight than traditional concrete roof tiles. Features for cable routing and management in the base of a solar roof tile can be enabling features for solarizing roof tiles and for generating electrical power using a solar roof installation that includes solar roof tiles.

The present application also describes systems and methods for installing a solarized roof tile system using roof tiles that weigh less than 400 lbs per 100 square feet. In some implementations, the solarized roof tile system includes solarized roof tiles and dummy tiles.

Figure 3:
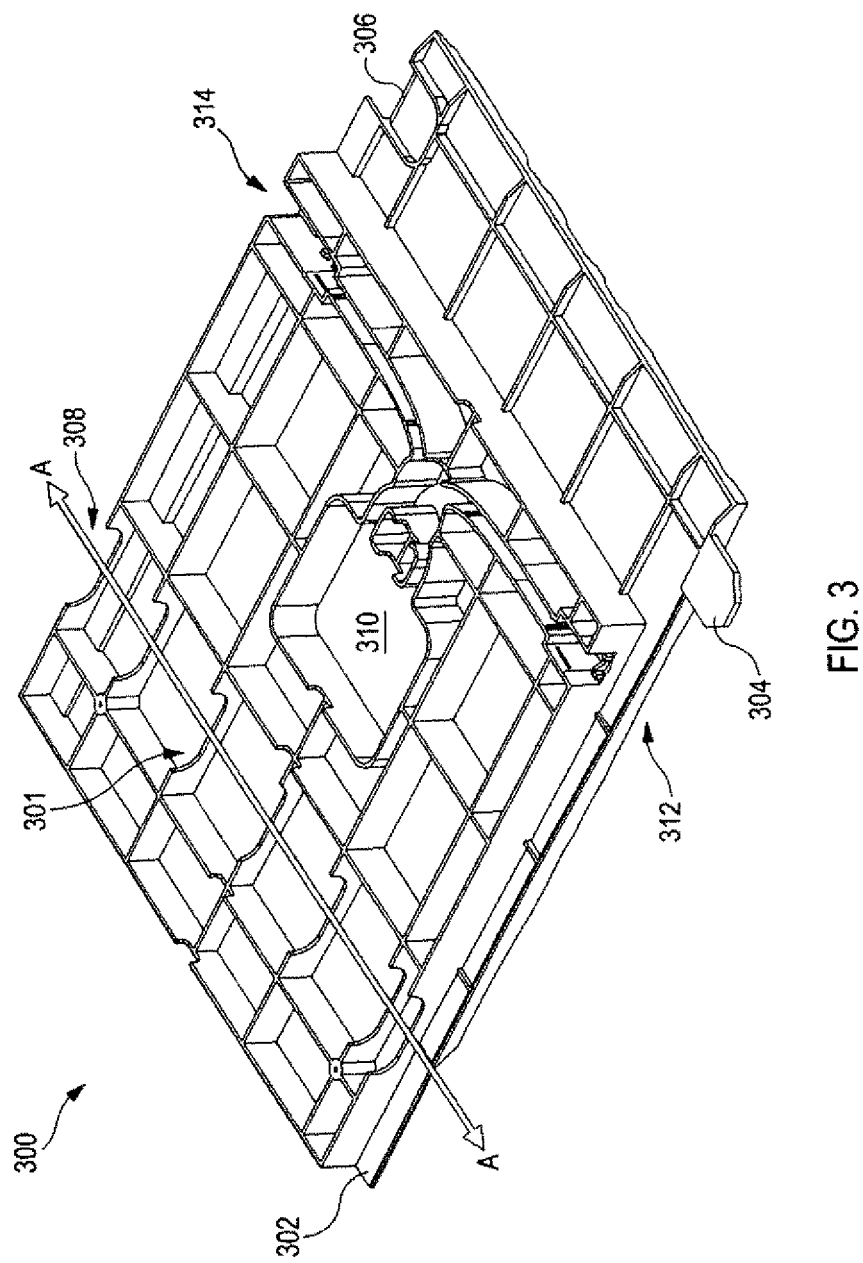
FIG. 3 is an isometric drawing of an example implementation of a solar roof tile.

FIG. 3 is an isometric drawing of an example implementation of a solar roof tile 300. FIG. 3 illustrates solar roof tile 300 with a rear side facing up. The rear side is the side that abuts the structure of the roof (for example, rafters, roof panels, and/or roof sheathing). A front side (not shown in FIG. 3) of solar roof tile 300 can have one or more photovoltaic solar panels attached to it. The front side of solar roof tile 300 can have a recess in which one or more photovoltaic solar panels can be located.

Solar roof tile 300 can be made of plastic. Solar roof tile 300 can be manufactured by injection molding. Solar roof tile 300 can be manufactured by 3D printing.

A base of solar roof tile 300 may include one or more ribs (for example, rib 301). Ribs may be included in the base of solar roof tile 300 to improve structural integrity of solar roof tile 300.

Solar roof tile 300 has an overlap 302 to collect and direct water landing on the front side of solar roof tile 300. Water can be directed down the roof to a gutter, for example.

Solar roof tile 300 has a tongue 304 and a groove 306 each operable to interlock solar roof tile 300 to a respective adjacent roof tile (for example, another solar roof tile or a dummy tile). Tongue 304 can interlock with a groove on an adjacent roof tile on one side of solar roof tile 300, and a tongue from an adjacent roof tile on the other side of solar roof tile 300 can interlock with groove 306.

Solar roof tile 300 has a channel 308 (also indicated by line A-A in FIG. 3) formed on the rear side of solar roof tile 300. For example, channel 308 is formed in one or more ribs (for example, rib 301) on the rear side of solar roof tile 300. Channel 308 can be used to accommodate one or more electrical cables. For example, channel 308 can be used to accommodate combiner cables.

Solar roof tile 300 has a hole 310 extending from the front side to the rear side of solar roof tile 300. Hole 310 can accommodate a junction box (not shown in FIG. 3). In one implementation, the male plug of the junction box (205 in FIG. 2B) is attached to a photovoltaic solar panel that includes one or more photovoltaic solar cells. In one implementation, the junction box includes a female plug (203 in FIG. 2B) located in hole 310. The female plug can be operable to receive a male plug connector. In one implementation, the junction box includes a diode (207 in FIG. 2B).

Figure 4:
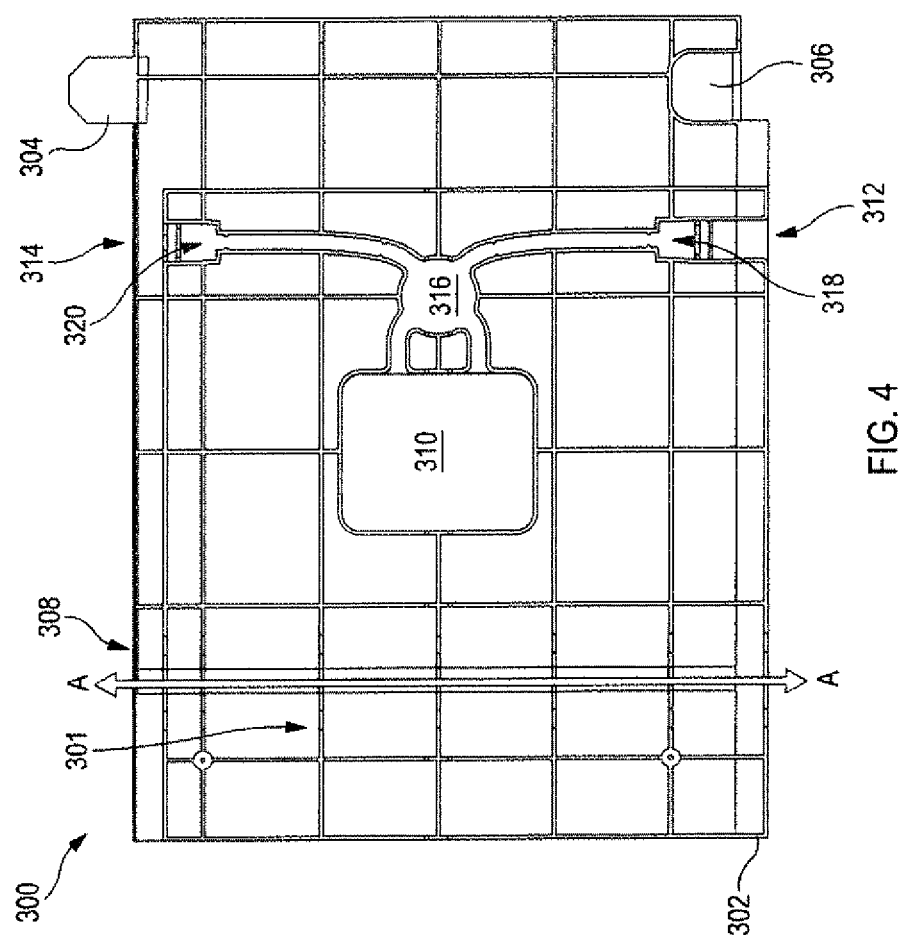
FIG. 4 is a plan view of the solar roof tile of FIG. 3.

FIG. 4 is a plan view of solar roof tile 300 of FIG. 3.

In one implementation, a photovoltaic solar panel comprising one or more photovoltaic solar cells is attached to the front side of solar roof tile 300. In operation, the photovoltaic solar panel can provide a single positive output connected to a positive conductor, and a single negative output connected to a negative conductor. Referring to FIG. 4, the positive and the negative connectors are fed through hole 310, optionally via a junction box (not shown in FIG. 3), and via a cable cross-over chamber 316 to connectors held by connector clips 318 and 320.

In one implementation, solar roof tile 300 of FIGS. 3 and 4 includes more than one photovoltaic solar panel. A solar roof tile that includes more than one photovoltaic solar panel (also referred to in the present application as a multi-tile) may cover a larger roof area than a solar roof tile that includes only a singe photovoltaic solar panel. A multi-tile may be a combination of more than one smaller solar roof tiles. A multi-tile may be manufactured as a single piece by injection molding, for example. A multi-tile may have one diode per photovoltaic solar panel, each diode operable to at least reduce the effect of a loss of performance of a respective solar roof panel. A solar roof installation may include a combination of individual solar roof tiles (for example, solar roof tile 300 of FIGS. 3 and 4), multi-tiles, and/or dummy tiles.

In one implementation, a connector held by connector clip 318 is within the envelope of solar roof tile 300 i.e. does not protrude from a side of solar roof tile 300. In the same implementation, a connector held by connector clip 320 extends beyond the envelope of solar roof tile 300 i.e. protrudes from a side of solar roof tile 300. In one roof installation, adjacent solar roof tiles are arranged such that a protruding connector on one solar roof tile can mate with a non-protruding connector on the other solar roof tile.

In another implementation, a connector held by connector clip 318 extends beyond the envelope of solar roof tile 300 i.e. protrudes from a side of solar roof tile 300. In the same implementation, a connector held by connector clip 320 is within the envelope of solar roof tile 300 i.e. does not protrude from a side of solar roof tile 300.

FIG. 5 is a side elevation view of solar roof tile 300 of FIG. 3. Solar roof tile 300 includes a front surface 322 and a rear surface 324 (see plan view of rear surface 324 in FIG. 4).

In some implementations, solar roof tile 300 is at least a similar thickness to a traditional roof tile such as a concrete, cement or clay roof tile (0.5"-1.5"). Since the rear surface of solar roof tile 300 can sit flush on roof sheathing and/or on a roof membrane, it can be desirable to form a cable management system on the rear side of solar roof tile 300.

In some implementations, solar roof tile 300 can be installed on strapping within an existing concrete roof. Primarily for aesthetic reasons, it can be desirable, in these implementations, for solar roof tile 300 to have at least a similar thickness to roof tiles of the existing concrete roof.

A photovoltaic solar panel 326 is attached to the front surface 322.

A method of manufacture of a solar roof tile assembly can include forming a laminated structure by laminating one or more sheets that include at least one photovoltaic solar cell, and attaching a junction box to the laminated structure to form a photovoltaic solar panel. The junction box can include a first DC connector and a second DC connector. Attaching the junction box to the laminated structure can include sealing the first DC connector to the laminated structure.

The method of manufacture can include forming solar roof tile 300 with a hole (for example, hole 310 of FIG. 3) that extends from a front side to a rear side of solar roof tile 300, and locating the junction box in the hole by inserting the first DC connector from the front side of solar roof tile 300 and attaching the second DC connector from the rear side.

Photovoltaic solar panel 326 for attachment to solar roof tile 300 can include a printed circuit board (208 in FIG. 2A), a plurality of photovoltaic solar cells each electrically connected to the printed circuit board, and a front sheet comprising a layer of plastic. The printed circuit board, the photovoltaic solar cells, and the layer of plastic can be at least part of a laminated structure attachable to solar roof tile 300. The layer of plastic can be a layer of transparent, UV-resistant plastic. The layer of plastic can be a layer of ethylene tetrafluoroethylene.

A method of manufacture of photovoltaic solar panel 326 for attachment to solar roof tile 300 can include forming a laminated structure by laminating one or more sheets that include a printed circuit board, a plurality of photovoltaic solar cells, and a front sheet. The front sheet can include a layer of plastic that can include ethylene tetrafluoroethylene.

A solar roof tile installation can include an array of solar roof tiles, each with a respective photovoltaic solar panel attached to the front side of the solar roof tile. A first photovoltaic solar roof panel (for example, photovoltaic solar roof panel 326) can include a respective positive conductor and a negative conductor, and a first diode electrically connected between the positive conductor and the negative conductor. A second photovoltaic solar roof panel can also include a respective positive conductor and a negative conductor, and a second diode electrically connected between the positive conductor and the negative conductor. The conductors of the first and the second photovoltaic solar panels can be electrically connected to form at least part of an electrically serial chain of solar roof panels having a one-way electrical direct current path that includes the first diode and the second diode, and operable to at least reduce the effect of a loss of performance of a solar roof panel.

A photovoltaic solar roof tile assembly can include a roof tile having a front and a rear surface and a single hole extending through the tile. A structure can be attached to the front surface of the roof tile. The structure can include a photovoltaic solar cell that in operation can provide a single positive output connected to a positive conductor and a single negative output connected to a negative conductor. The positive conductor and the negative conductor can extend from the structure attached to the front surface of the roof tile, through the hole of the roof tile to the rear surface of the roof tile. The structure can be laminated, and can include a printed circuit board, a first layer covering a surface of the printed circuit board, a second layer covering the photovoltaic solar cell, and a front sheet covering a front face of the second layer.

Figure 6A:
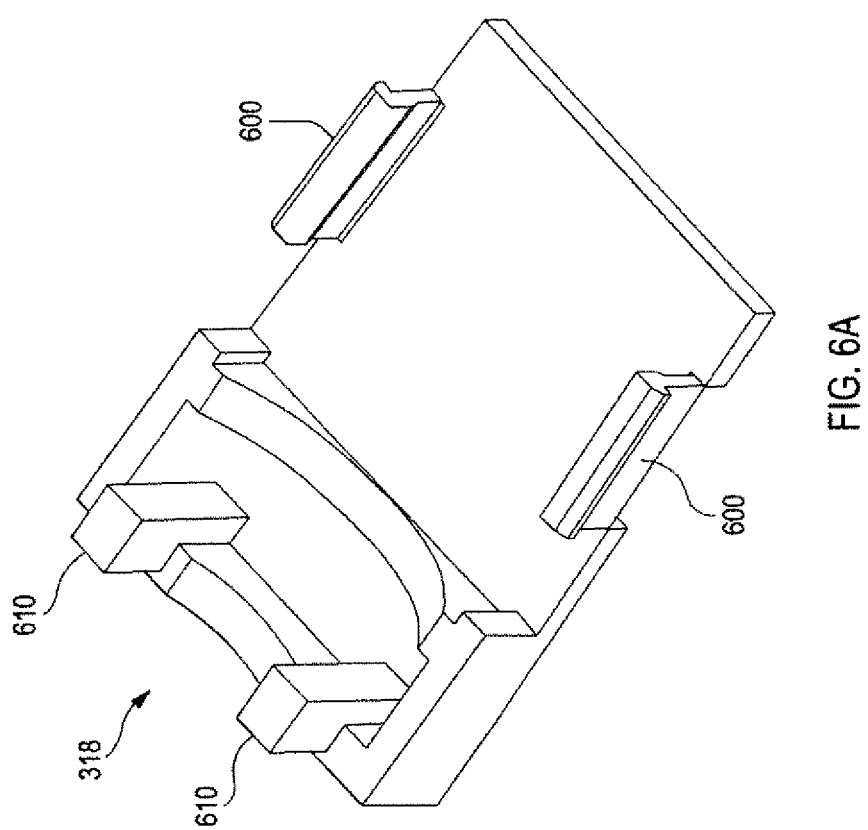
FIG. 6A is an isometric drawing of a connector clip for use in the tile of FIG. 3.
Figure 6D:
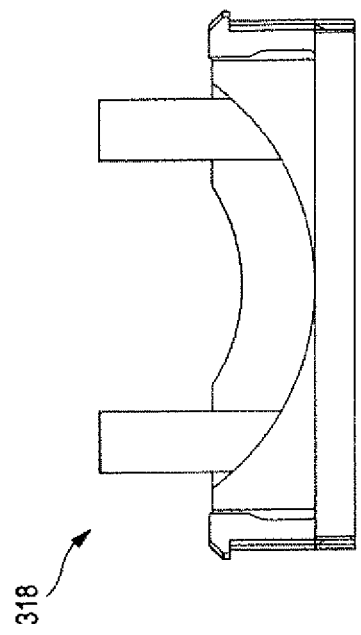
FIG. 6D is an end elevation view of the connector clip of FIG. 3.

FIG. 6A is an isometric drawing of connector clip 318 of FIG. 3. In one implementation, connector clip 318 is manufactured by injection molding.

In some implementations, installation can be easier when a connector on a solar roof tile is aligned with a connector on an adjacent solar roof tile. In some implementations, a connector on one solar roof tile snaps together with a corresponding connector on an adjacent solar roof tile. It can be desirable for a connector clip (for example connector clip 318 of FIG. 6A) to maintain an alignment by preventing axial rotation of a connector once it is clipped in place. Connector clip 318 can hold a connector (not shown in FIG. 6A) in place, and can advantageously prevent the connector from rotating while in place.

Figure 6B:
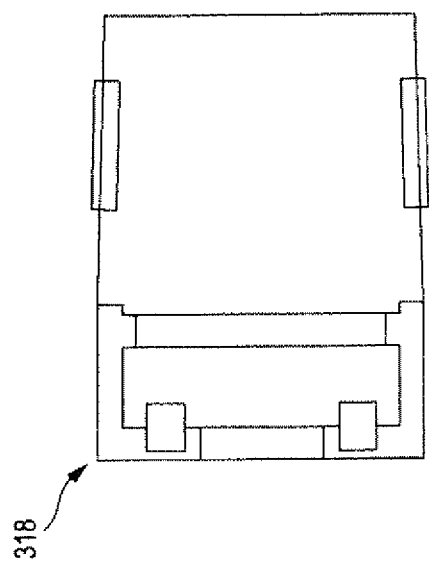
FIG. 6B is a plan view of the connector clip of FIG. 3.
Figure 6C:
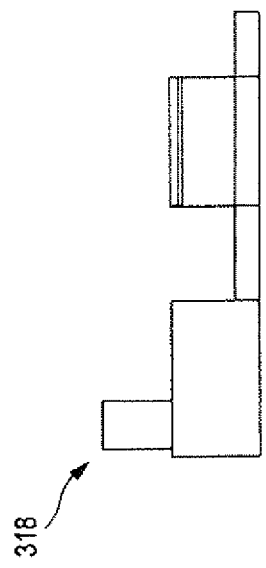
FIG. 6C is a side elevation view of the connector clip of FIG. 3.

FIG. 6B is a plan view of connector clip 318 of FIG. 3. FIG. 6C is a side elevation view of connector clip 318 of FIG. 3. FIG. 6B is an end elevation view of connector clip 318 of FIG. 3. The connector clip can include locking wings (600 of FIG. 6A) that snap into place at the connector joints on the back of the solar roof tile in positions 318 and 320 of FIG. 4. The electrical connectors can be standard MC4 male/female connectors, which require rotational alignment in order to make electrical connection. The connector clip can include a raised pin structure (610 of FIG. 6A) that restrains axial rotation of the electrical connectors when positioned on the back of the solar roof tile and snapped into place.

Figure 7:
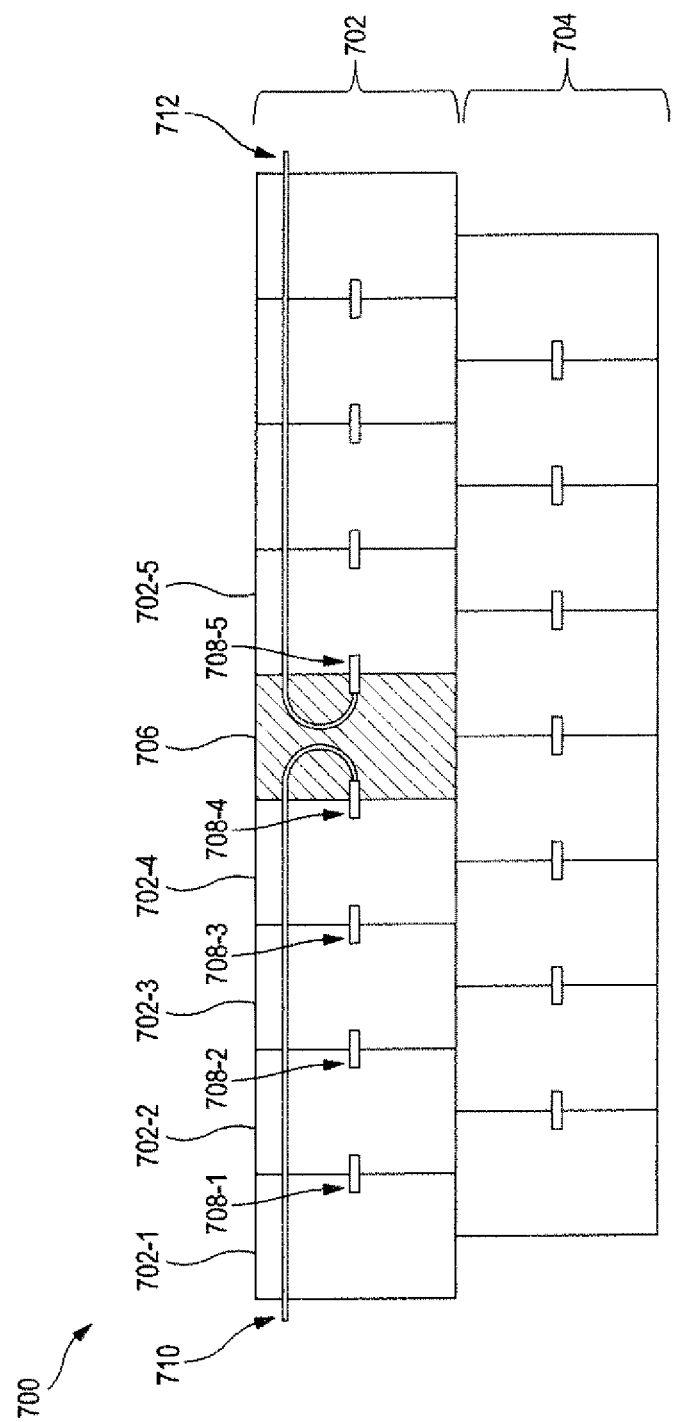
FIG. 7 is a schematic drawing of an example implementation of a portion of a roof installation that includes two rows of solar roof tiles, and at least one dummy tile.

FIG. 7 is a schematic drawing of an example implementation of a portion of a roof installation 700 that includes two rows of solar roof tiles 702 and 704, and a dummy tile 706. Row 702 includes solar roof tiles 702-1, 702-2, 702-3, 702-4, and 702-5. (Other individual roof tiles not called out for clarity.) Dummy tile 706 is located in row 702 between solar roof tiles 702-4 and 702-5. In some implementations, row 702 includes at least one other dummy tile (not shown in FIG. 7). In some implementations, row 704 includes one or more dummy tiles (not shown in FIG. 7).

The solar roof tiles of rows 702 and 704 are electrically joined by connecting elements (collectively referred to as connecting elements 708). For example, solar roof tiles 702-1 and 702-2 are joined by connecting element 708-1, solar roof tiles 702-2 and 702-3 by connecting element 708-2, and solar roof tiles 702-3 and 702-3 by connecting element 708-3. Each connecting element of connecting elements 708 (for example, connecting element 708-1) can include a male connector and a female connector (also referred to in the present application as a male plug and a female plug, respectively). For example, in one implementation, the male connector of connecting element 708-1 is located on solar roof tile 702-1, and the female connector of connecting element 708-1 is located in adjacent solar roof tile 702-2.

Each of the male and the female connectors can be secured in a respective connector clip (for example, connector clip 318 of FIG. 6).

In some implementations, dummy tile 706 does not have a photovoltaic solar panel attached to a front side of dummy tile 706. In other implementations, dummy tile 706 has a photovoltaic solar panel attached to the front side. In some implementations, electrical connections to dummy tile 706 are not installed. In some implementations, dummy tile 706 is the same as, or at least similar to, other solar roof tiles (e.g. solar roof tile 300 of FIG. 3) on a roof, but is not electrically communicatively coupled to contribute to power generated by the solar roof installation. Dummy tile 706 does not contribute to electrical power provided by solar roof installation. Dummy tile 706 is configured to have the same, or at least similar, physical dimensions and characteristics as solar roof tiles 702-1, 702-2, 702-3, 702-4, and 702-5.

In some implementations, a string of tiles will be connected in series with a limit on the number of tiles in each series that is less than the total number of solar roof tiles installed on the roof. The bypass diode (206 in FIG. 2B) is designed to ensure the series of tiles behaves electrically as if the tiles are electrically connected in parallel. In implementations, where the number of solar roof tiles in an individual string is less than the total number of solar roof tiles installed in the system, combiner cables can be used to gather the electrical power output from multiple strings into a single line, or into a lesser number of lines than there are strings in the system, for transmission to the balance of the electrical system.

Connecting element 708-4 is electrically communicatively coupled to combiner cable 710. Connecting element 708-5 is electrically communicatively coupled to combiner cable 712. In one implementation, combiner cables 710 and 712 terminate at a respective combiner box (not shown in FIG. 7). Combiner cable 710 carries electrical power generated at each of solar roof tiles 702-1 through 702-5 by their respective photovoltaic solar panel attached to a front side of solar roof tiles 702-1 through 702-5 (not shown in FIG. 7).

Figure 8B:
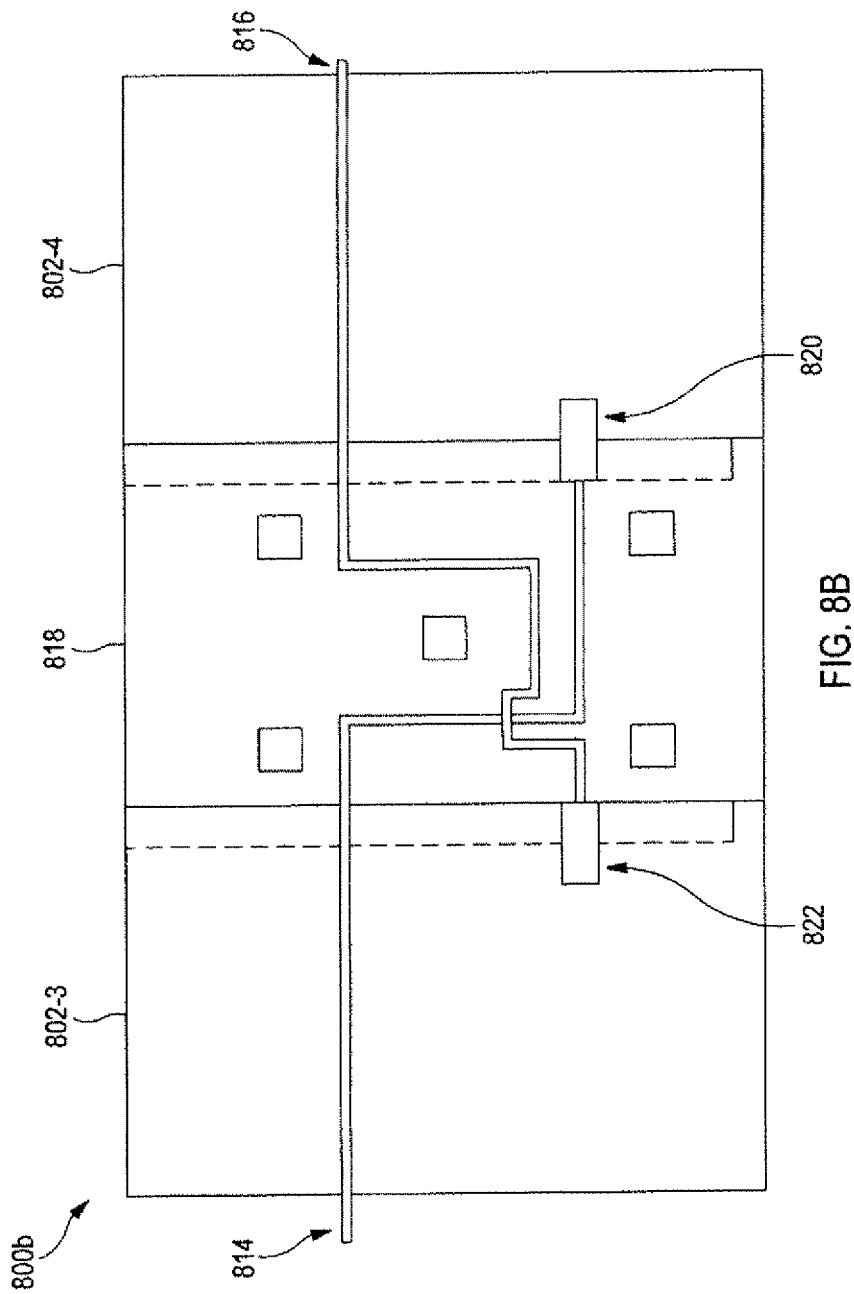
FIG. 8B is a schematic diagram of an example implementation of another portion of a roof installation illustrating an electrical communicative coupling between solar roof tiles and combiner cables.

When electrically communicatively coupled to the end solar roof tile in a string of multiple solar roof tiles, as connecting element 708-4 in FIG. 7, combiner cable 710 must be physically run behind the solar roof tiles and dummy tiles on the surface of the roof. A combiner cable channel (element A-A in FIG. 3 and FIG. 4) allows for the combiner cable to pass below the solar roof tiles and above the roof surface without physical interference. For the combiner cable 710 to run from the combiner cable channel, element A-A, to the electrical communicative couplings, 708-4, it must pass beneath a dummy tile, element 808 in FIG. 8A, which does not have the structural elements blocking the path of the cable in the manner that the solar roof tiles have. This cable routing can follow either the design illustrated in FIG. 8A, with combiner cable element 804 looping back to be electrically communicatively coupled to element 810 or in cross-over as illustrated in FIG. 8B, with combiner cable element 814 crossing behind the dummy tile to be electrically communicatively coupled to element 820.

FIG. 8A is a schematic diagram of an example implementation of a portion of a roof installation 800*a* illustrating an electrical communicative coupling between solar roof tiles 802-1 and 802-2, and combiner cables 804 and 806, respectively.

Roof installation 800*a* includes solar roof tiles 802-1 and 802-2, and dummy tile 808. Cable 804 is electrically communicatively coupled to solar roof tile 802-1 via connector 810. In one implementation, connector 810 is held in a connector clip (for example, connector clip 318 of FIG. 6). Cable 806 is electrically communicatively coupled to solar roof tile 802-2 via connector 812. In one implementation, connector 812 is held in a connector clip (for example, connector clip 318 of FIG. 6).

In the example implementation of FIG. 8A, cables 804 and 806 double-back along the row of solar roof tiles in opposite directions. In one implementation, each of cables 804 and 806 terminate at a respective combiner box (not shown in FIG. 8A).

FIG. 8B is a schematic diagram of an example implementation of another portion of a roof installation 800*b* illustrating an electrical communicative coupling between solar roof tiles 802-3 and 802-4, and combiner cables 814 and 816, respectively.

Roof installation 800*b* includes solar roof tiles 802-3 and 802-4, and dummy tile 818. Cable 814 is electrically communicatively coupled to solar roof tile 802-4 via connector 820. In one implementation, connector 820 is held in a connector clip (for example, connector clip 318 of FIG. 6). Cable 816 is electrically communicatively coupled to solar roof tile 802-3 via connector 822. In one implementation, connector 822 is held in a connector clip (for example, connector clip 318 of FIG. 6). In one implementation, each of cables 814 and 816 terminate at a respective combiner box (not shown in FIG. 8A).

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof.

Those of skill in the art will recognize that many of the methods or algorithms set out herein may employ additional acts, may omit some acts, and/or may execute acts in a different order than specified.

The various implementations described above can be combined to provide further implementations. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The various embodiments described above can be combined to provide further embodiments. All of the commonly assigned US patent application publications, US patent applications, foreign patents, foreign patent applications and non-patent publications referred to in this specification and/or listed in the Application Data Sheet are incorporated herein by reference, in their entirety.

What is claimed is:

1. A method of routing and securing electrical power cables for a solar roof installation, the solar roof installation comprising at least first and a second roof tiles, a first photovoltaic solar panel attached to a first front side of the first roof tile, and a second photovoltaic solar panel attached to a second front side of the second roof tile, and a dummy tile adjacent to one of the first or second roof tile, each of the first and second roof tiles including at least a first channel and a second channel, the second channel including a cable cross over chamber;

a first connector clip is located in the respective rear side of the first roof tile, the first connector clip positioned in a portion of the second channel at a first lateral edge of the first roof tile;

a second connector clip is located in the respective rear side of the second roof tile, the second connector clip positioned in a portion of the second channel at a first lateral edge of the second roof tile;

the method comprises:

securing a first connector and a second connector to the first and the second connector clips, respectively;

aligning the first and the second connectors;

forming a direct electrical connection between the first and the second connectors; and routing a combiner cable in the first channel in the respective rear side of each of the first and the second roof tiles, the combiner cable electrically connected to one of the first and second connectors via the dummy tile, the combiner cable providing electrical power output from the first and second photovoltaic solar panels of the at least first and second roof tiles.

2. The method of claim 1, wherein each of the first and second roof tiles includes a hole extending from the front side of each of the first and second roof tiles to the rear side of each roof tile, the hole in the first roof tile providing access to the first photovoltaic solar panel and the hole in the second roof tile providing access to the second photovoltaic solar panel for providing respective electrical connections to the first and second photovoltaic solar panel using the respective cable cross over chamber and second channels of the first and second roof tiles.

3. The method of claim 1, comprising providing at least first and second pairs of the at least first and second pairs of roof tiles, wherein the dummy tile is positioned between first and second pairs of the first and second roof tiles.

4. The method of claim 3, wherein the combiner cable connected to the first connector of the first roof tile of the first pair is routed in the first channel of the first roof tile of the first pair.

5. The method of claim 3, wherein the combiner cable connected to the first connector of the first roof tile of the first pair is routed in the first channel of the first roof tile of the second pair.

6. The method of claim 1, wherein the photovoltaic solar panel comprises a printed circuit board, a plurality of photovoltaic solar cells each electrically connected to the printed circuit board, and a front sheet comprising a layer of plastic.

7. The method of claim 6, wherein the printed circuit board, the plurality of photovoltaic solar cells, and the layer of plastic forming at least part of a laminated structure.

8. The method of claim 1, wherein the at least one second channel of each of the at least first and second roof tiles accommodates a cable that includes at least one of a positive conductor and a negative conductor electrically connected to the photovoltaic solar panel.

9. The method of claim 1, wherein the at least one second channel of each of the first and second roof tiles includes a connector joint at each first end and second end of the roof tile, each connector clip of the first and second connector clips having a slot to receive a respective connector to prevent axial rotation of the respective connector and a portion that attaches to the connector joint for holding the connector clip in the connector joint.

10. The method of claim 1, wherein the combiner cable runs beneath an upper surface of the dummy tile to electrically connect to the first or second connector.

* * * * *